United States Patent [19]

Sakurai et al.

[11] Patent Number: 4,654,692
[45] Date of Patent: Mar. 31, 1987

[54] SEMICONDUCTOR DEVICE OF RESIN-SEAL TYPE

[75] Inventors: Toshiharu Sakurai, Yokohama; Seiichi Hirata, Yokosuka, both of Japan

[73] Assignee: Kabushiki Kaisha Toshiba, Kawasaki, Japan

[21] Appl. No.: 894,508

[22] Filed: Aug. 6, 1986

Related U.S. Application Data

[63] Continuation of Ser. No. 625,541, Jun. 28, 1984, abandoned.

[30] Foreign Application Priority Data

Jun. 30, 1983 [JP] Japan .................. 58-118519

[51] Int. Cl.⁴ .................. H01L 23/28; H01L 23/48
[52] U.S. Cl. .................. 357/68; 357/67; 357/72
[58] Field of Search .................. 357/68, 72, 71, 67

[56] References Cited

U.S. PATENT DOCUMENTS 3,766,448 10/1973 Luce et al. .
4,438,450 3/1984 Sheng et al. .................. 357/67
4,467,345 8/1984 Ozawa .................. 357/68

FOREIGN PATENT DOCUMENTS 3115406 6/1982 Fed. Rep. of Germany .
2088629 10/1981 United Kingdom .

Primary Examiner—Andrew J. James
Assistant Examiner—S. V. Clark
Attorney, Agent, or Firm—Schwartz, Jeffery, Schwaab, Mack, Blumenthal & Evans

[57] ABSTRACT

Slits are formed in the metal wiring layer formed on the semiconductor of a semiconductor device to be resin sealed thereby to divide the total width of the metal wiring layer into divided widths each of the order of 30 to 40 μm, whereby stress generated in the metal wiring layer is absorbed and prevented from causing cracking, deformation, and other defects. The slits are arranged to be substantially parallel to the peripheral side of the device which is most closely located to the wiring part.

5 Claims, 6 Drawing Figures

SEMICONDUCTOR DEVICE OF RESIN-SEAL TYPE

This application is a continuation of application Ser. No. 625,541, filed June 28, 1984, now abandoned.

BACKGROUND OF THE INVENTION

This invention relates generally to semiconductor devices of the resin-seal type and more particularly to the surface structures of semiconductor pellets of large areas.

A resin-seal type semiconductor device is fabricated by mounting a semiconductor pellet on a lead frame, carrying out wire bonding, and thereafter sealing the device with a synthetic resin such as an epoxy resin.

A typical known semiconductor device of resin-seal type in pellet form, as will be described more fully hereinafter, comprises a silicon substrate, a field oxide film formed on the substrate and surrounding an element region, a MOS transistor, for example formed on the element region, an interlayer insulation film disposed over the field oxide film, a wiring layer extended from the element region, a bonding pad part 5 for connection to the wiring layer, which together with the wiring layer is formed on the layer insulation film, and a passivation film deposited on the upper surface of the structure except for a bonding pad window formed in the part of the passivation film correspondingly above the bonding pad part.

In a conventional device of the above described structure certain parts thereof are subjected to stress by the sealing resin as a consequence of sudden variations in the surrounding temperature. Consequently, cracks readily develop in such parts, whereby moisture resistance is lost. Furthermore, problems such as deformation in the wiring layer below the passivation film, and even wire breakage, occur together with cracking. A further problem is the propagation of the cracks to the layer insulation film and the field oxide film, which gives rise to further problems such as lowering of the semiconductor device performance and a drop in the yield during production thereof.

SUMMARY OF THE INVENTION

Accordingly, it is a general object of this invention to provide a resin-seal type semiconductor device in which undesirable occurrences such as deterioration of moisture resistance and wire breakage in the aluminum wiring layer due to cracking in the passivation film are prevented.

For achieving the above stated object, the principal characteristic of the resin-seal type semiconductor device according to this invention is the forming of slits in the wiring part of the semiconductor surface to be resin sealed for absorbing any stress which would otherwise be imparted to that wiring part.

The nature, utility, and further features of this invention will be more clearly apparent from the following detailed description when read in conjunction with the accompanying drawings, briefly described below.

DETAILED DESCRIPTION OF THE INVENTION

Figure 4A:
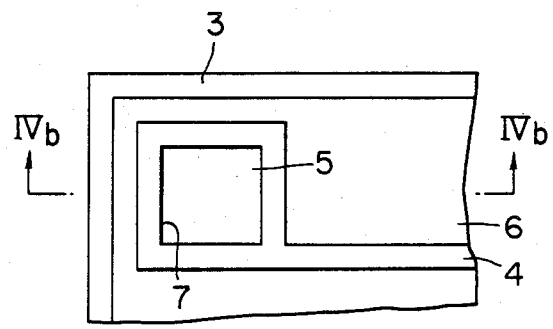
FIG. 4a is a view similar to FIG. 1a showing the structure of one example of a pellet of a known resin-seal type semiconductor known.
Figure 4B:
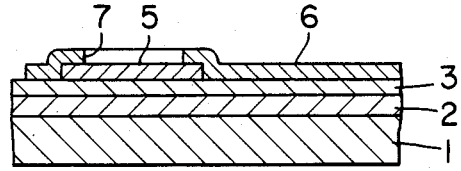
FIG. 4b is a section taken along the plane indicated by line IVb—IVb in FIG. 4a as viewed in the arrow direction.

As conducive to a full understanding of this invention, the general nature and limitations of a conventional resin-seal type semiconductor device will first be briefly described. Referring to FIGS. 4a and 4b, a field oxide film 2 is formed on the upper surface of a silicon substrate of p-type, for example, and on an element region (not shown) surrounded by this field oxide film 2, an N-channel MOS transistor, for example, is formed. Furthermore, above the field oxide film 2 in the peripheral part of the semiconductor pellet, an aluminum wiring layer 4 extended from the element region and a bonding pad part 5 for connection to this aluminum wiring layer 4 are formed over an interlayer insulation film 3 such as a CVD oxide film interposed therebetween. Still further, over the entire upper surface, a passivation film 6 is deposited except for a bonding pad window 7 formed in the part of the passivation film 6 corresponding to the bonding pad part 5.

In a resin-seal type semiconductor device of a structure as described above, particularly in the case of a pellet of large area of 25 mm$^2$ or more, the stepped parts in the vicinity of the window 7 for the bonding pad of the passivation film 6 and the stepped parts of the aluminum wiring layer 4 are subjected to stress due to the sealing resin 9 as a consequence of abrupt variations in temperature of the environment or the surroundings. Consequently, cracks easily develop, and moisture resistance is lost. The occurrence of such cracks is particularly pronounced at the four corners of the pellet and is more likely with wiring layers of large width. Furthermore, together with the development of cracks, problems such as occurrence of deformation in the aluminum wiring layer 4 below the passivation film 6 and even wire breakage in extreme cases are encountered. Still another problem is the propagation of the cracks to the interlayer insulation film 3 and the field oxide film 2 to give rise to further problems such as lowering of the performance of the semiconductor device and a drop in the yield during production thereof.

Figure 1A:
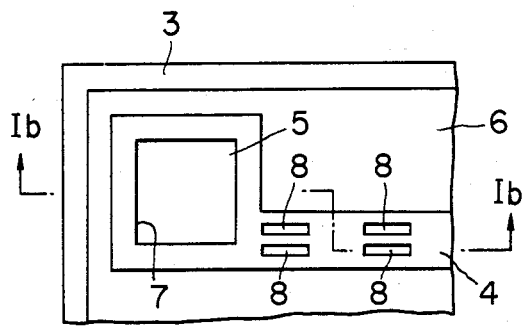
FIG. 1a is greatly magnified, fragmentary plan view showing the structure of one example of a pellet of a resin-seal type semiconductor according to this invention.
Figure 2:
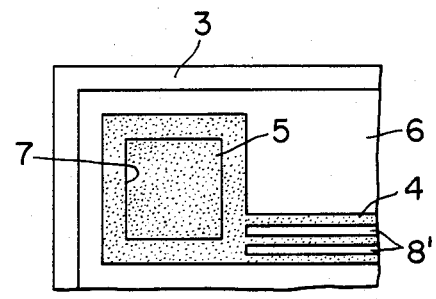
FIG. 2 is a view similar to FIG. 1a showing another example of a pellet of a resin-seal type semiconductor of the invention.
Figure 1B:
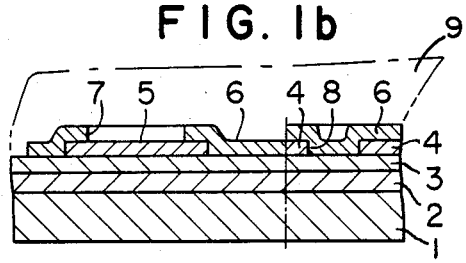
FIG. 1b is a section taken along the plane indicated by line Ib—Ib in FIG. 1a as viewed in the arrow direction.

The above described problems and limitations accompanying the conventional resin-seal type semiconductor device have been overcome by this invention, which will now be described in detail with respect to preferred embodiments thereof illustrated in FIGS. 1a, 1b, and 2. In FIGS. 1a, 1b, and 2, those parts which are the same or equivalent to corresponding parts in FIGS. 4a and 4b are designated by like reference numerals. Detailed description of such common parts will not be repeated.

The semiconductor device of this invention shown in FIGS. 1a and 1b differs from that illustrated in FIGS. 4a and 4b in that, in the aluminum wiring layer 4, one or more slits 8 are provided at suitable specific spacing and each of the slits 8 is arranged to be substantially parallel to a peripheral side of the device which is most closely located to the wiring part. These slits 8 are formed by etching at the time of formation of the aluminum wiring layer. In other respects, similarly as in the known art, the passivation film 6 is deposited as a coating, and the window 7 for the bonding pad is formed. Particulars of the slits 8 such as their number, shape, and spacing interval should be designed in accordance with factors such as the area of the semiconductor pellet and the thickness of the sealing resin 9.

By thus providing the slits 8 in the aluminum wiring layer 4, stress arising particularly at the periphery of the pellet from temperature variation in the sealing resin 9 can be dispersed. As a result, cracks do not readily develop in the passivation film 6, and wire breakage in the aluminum wiring layer 4 can be prevented.

The above described result was verified by the following experiments. DIP resin-seal type semiconductor devices of 42 pins were fabricated by sealing a conventional pellet (64 mm$^2$) as shown in FIGS. 4a and 4b and a pellet (64 mm$^2$) of this invention as shown in FIGS. 1a and 1b respectively with two kinds A and B of epoxy resin having the characteristics shown in Table 1.

TABLE 1

|  | Epoxy A | Epoxy B |
|---|---|---|
| Coeff. of thermal expansion $\alpha_1$ (°C.$^{-1}$) (Tg or lower) | $2.1 \times 10^{-5}$ | $2.1 \times 10^{-5}$ |
| Coeff. of thermal expansion $\alpha_2$ (°C.$^{-1}$) (Tg or higher) | $6.5 \times 10^{-5}$ | $6.7 \times 10^{-5}$ |
| Glass transition temperature, Tg (°C.) | 146 | 157 |

Each semiconductor device thus fabricated was subjected to 100 cycles of a temperature variation test, each cycle comprising: 25° C. (5 min.)→150° C. (30 min.)→25° C. (5 min.)→−55° C. (5 min.). Each device (pellet) was thereafter inspected for the state of development of cracks in the passivation film on the pellet surface and for deformation of aluminum wiring. The results are shown in Table 2.

TABLE 2

|  | Cracks in passivation film | Al wiring layer deform |
|---|---|---|
| Example 1 (epoxy resin A) | Only in bonding pad part | none |
| Example 2 (epoxy resin B) | none | none |
| Prior Art Example 1 (epoxy resin A) | 200 to 400 μm | present |
| Prior Art Example 2 (epoxy resin B) | 100 to 200 μm | none |

As is apparent from the results set forth in Table 2 above, cracks appeared in the passivation films of the Prior Art Examples 1 and 2. The dimensions "200 to 400 μm" and "100 to 200 μm" in Table 2 indicate distance between the extreme end of a crack and the dicing line. It is to be observed also in Table 2 that a deformation occurred in the aluminum wiring layer in the Prior Art Example 2. In contrast, in Examples 1 and 2 of this invention, formation of cracks was suppressed, and deformation of the aluminum wiring layer was prevented.

In another embodiment of this invention as shown in FIG. 2, a plurality of slits 8' are provided in parallel and continuously in the direction of extension of the aluminum wiring layer 4. Other structural characteristics of this device are the same as those of the preceding embodiment of the invention and therefore will not be described again.

Figure 3:
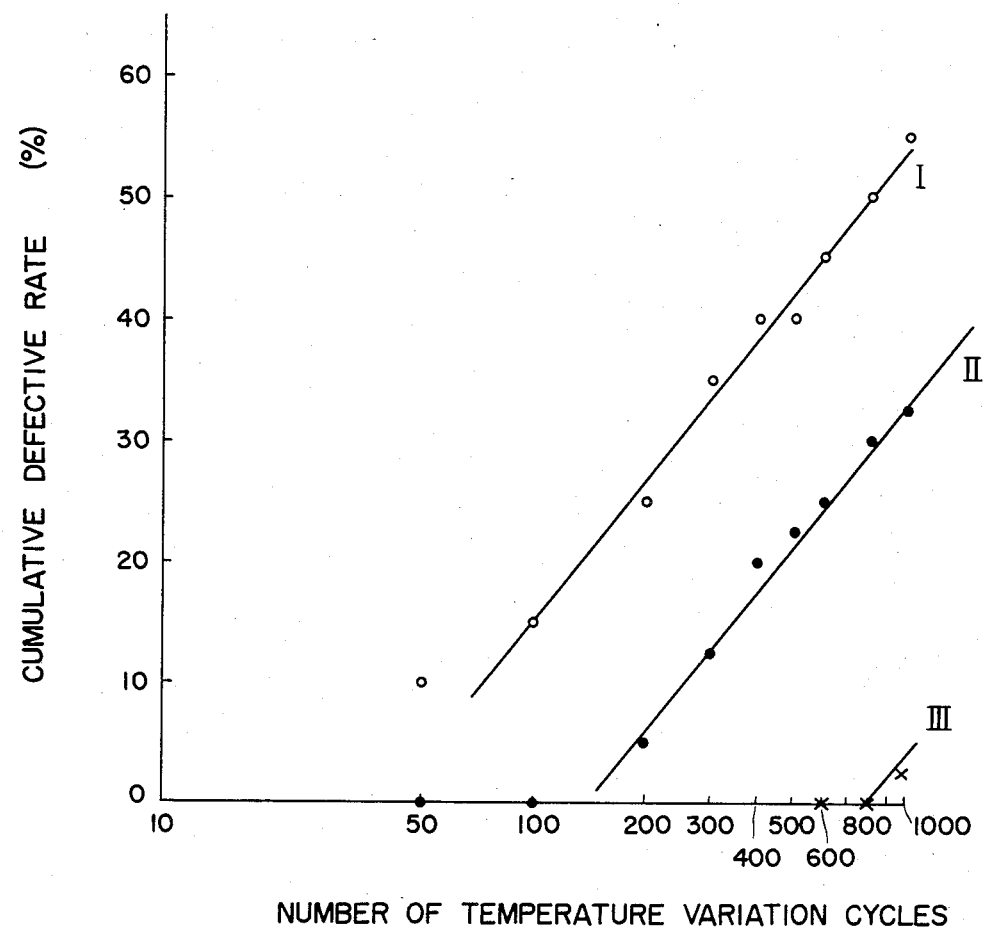
FIG. 3 is a graph indicating characteristics of number of temperature variation cycles versus rate of occurrence of defective articles.

The effectiveness and utility of this invention is further indicated in FIG. 3, which shows the relationships between number of cycles of temperature variations and rate of occurrence of defects in semiconductor devices in three cases based on results of temperature variation tests. In each case, an aluminum wiring layer of 100-μm width was used. In the first case, indicated by the characteristic curve I, no slit whatsoever was provided in the aluminum wiring. In the second case, indicated by the curve II, one slit only was provided, and in the third case, indicated by the curve III, two slits were provided.

Since no slit was provided in the case represented by curve I in FIG. 3, the width of the aluminum wiring layer was 100 μm, whereby cracks readily developed in the sealing resin of the semiconductor device, and, after 500 repeated cycles of temperature variation, 50 percent of the product was found to be defective. In the second case (curve II) of only one slit, the width of the aluminum wiring layer was of the order of 100/2=50 μm, whereby the rate of occurrence of defective product was greatly reduced. In the third case (curve III) of two slits, the width of the aluminum wiring layer was of the order of 100/3=33 μm, whereby the defective rate was reduced to an order which could cause almost no problem in actual practice.

According to this invention as described above, stress generated particularly at the periphery of the pellet by thermal deformation of the sealing resin can be dispersed by forming slits in the wiring part of the semiconductor device such that the slits are arranged to be substantially parallel to a periperal side of the device which is most closely located to the wiring part. As a result, the occurrence of cracks in the passivation film can be prevented and, at the same time, deformation of the wiring part can be prevented. Therefore, improvements in the moisture resistance and yield of the resin-seal type semiconductor devices according to this invention can be expected.

What we claim is:

1. In a resin-seal type semiconductor device having a wiring part of a semiconductor surface sealed with a resin, the improvement which comprises at least one slit formed in the wiring part for absorbing stress imparted thereto, each of said slits being arranged to be substantially parallel to a peripheral side of the device which is most closely located to the wiring part.

2. A resin-seal type semiconductor device according to claim 1 in which a plurality of slits are formed in the wiring part in a mutually parallel and spacedapart state.

3. A resin-seal type semiconductor device according to claim 1 in which said at least one slit is formed by providing one or more separated slits in the wiring part in the longitudinal direction thereof.

4. A resin-seal type semiconductor device according to claim 1 in which the wiring part is an aluminum wiring layer.

5. A resin-seal type semiconductor device comprising:
a semiconductor having resin-sealed surface;
a wiring layer disposed above said surface;

a means, formed integrally with said wiring layer and defining at least one slit, for absorbing stress forces imparted thereto and thereby preventing the formation of cracks in said device;

wherein said means defines at least one slit oriented to be substantially parallel to a peripheral side of the device which is most closely located to the wiring part.

* * * * *